US006979611B2

(12) United States Patent
Shin et al.

(10) Patent No.: US 6,979,611 B2
(45) Date of Patent: Dec. 27, 2005

(54) METHOD FOR FABRICATING SEMICONDUCTOR DEVICE

(75) Inventors: Dong Suk Shin, Kyoungki-do (KR); Seung Woo Jin, Kyoungki-do (KR); Sang Woon Park, Kyoungki-do (KR); Yun Hyuck Ji, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 195 days.

(21) Appl. No.: 10/615,708

(22) Filed: Jul. 9, 2003

(65) Prior Publication Data
US 2004/0014307 A1 Jan. 22, 2004

(30) Foreign Application Priority Data
Jul. 19, 2002 (KR) ...................... 10-2002-0042398

(51) Int. Cl.⁷ ........................................ H01L 21/8249
(52) U.S. Cl. ..................... 438/233; 438/523
(58) Field of Search ................ 438/233, 231, 438/238, 239, 229, 241, 253, 370, 383, 396, 438/399, 142, 197, 299, 301, 303, 304, 510, 438/514, 518, 523, 533, 571, 584, 597, 629, 438/672–675, FOR 173; 257/E21.432, E21.591

(56) References Cited

U.S. PATENT DOCUMENTS

| | | | |
|---|---|---|---|
| 5,397,724 A * | 3/1995 | Nakajima et al. ........... 438/257 |
| 5,681,770 A * | 10/1997 | Ogura et al. ................ 438/257 |
| 5,792,695 A * | 8/1998 | Ono et al. ................... 438/257 |
| 5,916,369 A * | 6/1999 | Anderson et al. ........... 118/715 |
| 6,100,202 A * | 8/2000 | Lin et al. ..................... 438/734 |
| 6,171,954 B1 * | 1/2001 | Hsu ........................... 438/656 |
| 6,204,134 B1 | 3/2001 | Shih |
| 6,221,747 B1 | 4/2001 | Wu et al. |
| 6,348,409 B1 | 2/2002 | Shih |
| 6,368,880 B2 | 4/2002 | Singhri et al. |
| 6,395,628 B1 | 5/2002 | Doan |

FOREIGN PATENT DOCUMENTS

| JP | 3014225 | 1/1991 |
|---|---|---|
| JP | 7130875 | 5/1995 |

* cited by examiner

Primary Examiner—Brook Kebede
(74) Attorney, Agent, or Firm—Ladas & Parry LLP

(57) ABSTRACT

In a silicon substrate having a contact hole in a device region, the contact resistance between the contact plug and the silicon substrate is reduced by preventing formation of an undesirable layer therebetween by treating the exposed surface of the substrate before forming the contact plug. Further, a two-layered contact plug consisting of a first contact plug layer having high impurity concentration and a second contact plug layer having low impurity concentration, on the interlayer insulating film including the exposed surface of the substrate. The interface between the silicon substrate and the contact plug is thermally treated at low temperature, and the first contact plug layer having high impurity concentration and the second contact plug layer having low impurity concentration, are formed, so that the resistance between the silicon substrate and the contact plug can be reduced, thereby increasing the operation speed of the device. thereby increasing the operation speed of the device.

18 Claims, 2 Drawing Sheets

METHOD FOR FABRICATING SEMICONDUCTOR DEVICE

BACKGROUND OF THE INVENTION

1. Field of the Invention

The present invention relates to a method for fabricating a semiconductor device, and more particularly, to a method for fabricating a semiconductor device, which can reduce the resistance between a silicon substrate and a contact plug and thus increase the operation speed of the device.

2. Description of the Prior Art

As the high integration level of a semiconductor device is increased, the linewidth required to realize the device is gradually reduced. According to this tendency, various processes are studied and developed to make device characteristics good. Particularly, in order to improve the operation efficiency of a device, there are made new attempts to develop a contact-forming process, which can reduce the resistance between a contact plug and a silicon substrate.

In semiconductor devices according to the prior art, a contact plug based on impurity-doped polycrystalline silicon was formed on a silicon substrate. If the interface between the silicon substrate and the polycrystalline silicon contact plug is ideal, there will be no resistance caused by a difference in work function, because the contact between the silicon substrate and the contact plug is the contact between the same materials. Namely, if the silicon substrate and the polycrystalline silicon contact plug have the same impurity concentration, the resistance therebetween will be very low.

However, the resistance between the polycrystalline silicon contact region and the silicon substrate is generally relatively high. Generally, a N-doped contact region having a contact area of 0.1 $\mu m^2$ has a high resistance of about 10 kΩ.

Such a high resistance is known as attributing to native oxides and carbon-containing residues formed at the interface between the polycrystalline silicon contact plug and the silicon substrate.

Generally, in a process of forming a polycrystalline silicon contact plug according to the prior art, although the deposition of polycrystalline silicon is carried out immediately after conducting a wet cleaning process, an increase in this contact resistance cannot be effectively inhibited.

In the prior wet cleaning process, the silicon substrate is cleaned with non-organic volatile compound solution and de-ionized water. Thus, the prior wet cleaning process does not effectively prevent the native oxides and the carbon-containing residues from being formed on the surface of the silicon substrate. As an alternative method to overcome an increase in resistance according to a reduction in contact area as described above, there is a method in which the selective epitaxial growth (SEG) of silicon is used to prevent the resistance increase caused by the native oxides and the grain boundary. In this silicon SEG, low-pressure chemical vapor deposition (LPCVD) is mainly used. Moreover, as reaction gas, dichlorosilane(DSC)/$H_2$/HCl or monosilane (MS)/$H_2$/HCl is mainly used. In addition, the silicon SEG generally needs to be conducted at a high temperature higher than 800° C.

This high-temperature process is a factor making semiconductor device characteristics difficult to be ensured. Accordingly, there is urgently required to develop a process, which allows the effective growth of monocrystalline silicon having low contact resistance at the lowest possible temperature.

Particularly, in the prior art, there is required a process of thermally treating the silicon substrate with hydrogen ($H_2$) gas at a high temperature higher than generally 800° C., before conducting the silicon SEG.

SUMMARY OF THE INVENTION

Accordingly, the present invention has been made to solve the above-mentioned problems occurring in the prior art, and an object of the present invention is to provide a method for fabricating a semiconductor device, which can prevent the deterioration of device characteristics caused by the high temperature heat treatment.

Another object of the present invention is to provide a method for fabricating a semiconductor device, which can reduce the resistance between a silicon substrate and a contact region, and thus to increase the operation speed of the device.

To achieve the above objects, in one embodiment, the present invention provides a method for fabricating a semiconductor device, which comprises the steps of: forming a device isolation film defining a device region in a silicon substrate; depositing a gate electrode material film on the substrate and patterning the deposited gate electrode material film so as to form a gate electrode on the substrate; implanting impurity ions into the silicon substrate so as to form junction regions in the silicon substrate; forming an interlayer insulating film on the substrate and selectively patterning the interlayer insulating film so as to partially expose the surface of the substrate; and forming a two-layered contact plug consisting of a first contact plug layer having high impurity concentration and a second contact plug layer having low impurity concentration, on the interlayer insulating film including the exposed surface of the substrate.

In another embodiment, the present invention provides a method for fabricating a semiconductor device, which comprises the steps of: forming a device isolation film defining a device region in a silicon substrate; depositing a conductive layer on the substrate and patterning the deposited conductive layer so as to form a gate electrode on the substrate; implanting impurity ions into the substrate so as to form junction regions in the substrate; forming an interlayer insulating film on the substrate and selectively patterning the interlayer insulating film so as to partially expose the surface of the substrate; treating the exposed surface of the substrate; and forming a two-layered silicon contact plug consisting of a first contact plug layer having high impurity concentration and a second contact plug layer having low impurity concentration, on the interlayer insulating film including the exposed surface of the substrate.

BRIEF DESCRIPTION OF THE DRAWING

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
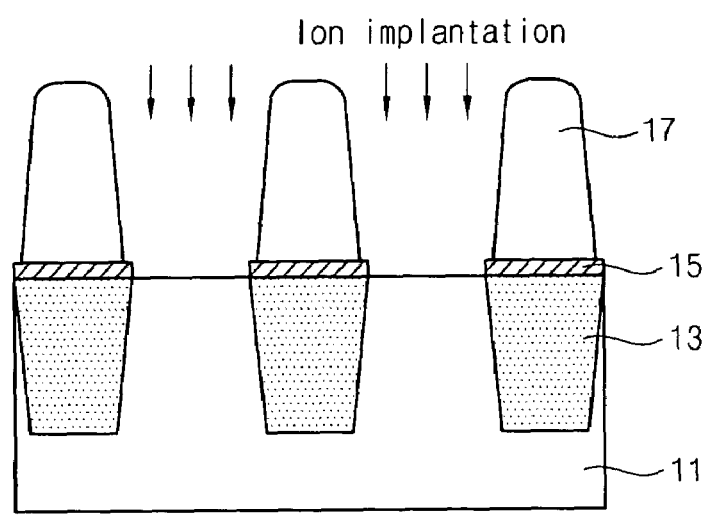
FIGS. 1 to 3 are cross-sectional views illustrating a method for fabricating a semiconductor device according to the present invention.

Hereinafter, the present invention will be described in detail.

A method for fabricating a semiconductor device according to the present invention is an improved process, which can overcome the prior problems and achieve the formation of a contact plug in a simplified manner. As described above, in order to reduce the resistance between a silicon substrate and a contact plug, native oxides need to be removed from the interface therebetween, and also crystalline defects, such as grain boundary, in the interface, needs to be reduced. In addition, a process, which can be carried out at low temperature, needs to be developed.

According to the present invention, there is proposed a method wherein monocrystalline silicon is grown at the interface between the silicon substrate and the contact plug. Particularly, in the present invention, monocrystalline silicon is first grown at the interface at a low temperature lower than 700° C., and then polycrystalline silicon is grown, thereby forming a contact plug having improved characteristics.

According to the present invention, the contact plug is formed using $MS/H_2$ base gas by atmospheric pressure chemical vapor deposition or low-pressure chemical vapor deposition.

The fabricating method according to the present invention is carried out under conditions as described later. Particularly, in order to effectively reduce the resistance between the silicon substrate and the contact plug, the surface of the silicon substrate needs to be effectively treated, before the contact plug is formed on the silicon substrate.

In this case, as a process of treating the surface of the silicon substrate to reduce the resistance between the silicon substrate and the contact plug, there is used one or more selected from a dry cleaning process of removing a damage layer caused by dry etching; a wet cleaning process of removing carbon-containing residues and native oxides; a surface cleaning process of thermally treating the substrate surface with hydrogen gas at high temperature; a native oxide removal process; a cleaning process utilizing a laser; and a combination of two or more of the above processes.

In the process of removing native oxides as described above, nitrogen fluoride ($NF_3$) gas is used in the form of remote plasma such that a silicon-fluorine (Si—F) bond is finally formed on the substrate surface. This can effectively maintain the substrate surface at a clean state.

Moreover, the process of thermally treating the substrate surface with hydrogen gas is carried out at a high temperature higher than 800° C., and thus has a difficulty in realizing a device.

Thus, in order to overcome this disadvantage, the surface treatment process using a laser is proposed according to the present invention. Namely, a portion of the substrate surface requiring surface treatment is locally treated with a laser, so that the deterioration of device characteristics caused by the high temperature heat treatment can be prevented.

Hereinafter, preferred embodiments of the present invention will be described in detail with reference to the accompanying drawings.

FIG. 1 is a cross-sectional view illustrating a method for fabricating method of a semiconductor device. As shown in FIG. 1, a device isolation film 13 defining a device region is formed in a silicon substrate 11 by shallow trench isolation (STI).

Then, although not shown in the figures, a conductive layer is formed on the silicon substrate and patterned to form a gate electrode. Next, as shown in FIG. 1, impurities are implanted into the silicon substrate 11 so as to form impurity junctions (not shown) in the silicon substrate.

Thereafter, a buffer layer 15 and an interlayer insulating film 17 is successively deposited on the upper surface of the entire structure, and patterned so as to partially expose the surface of the silicon substrate 11.

Following this, the exposed surface of the silicon substrate 11 is treated as described above. Then, impurity ions are implanted into the exposed surface of the silicon substrate using the patterned insulating film 14 as a mask, such that the resistance between the silicon substrate and a contact plug is reduced. In this impurity ion implantation, P or As ions are used as the impurity ions. In addition, this impurity ion implantation is carried out at an implantation energy of 10–100 KeV and a doping concentration of 1E10 to 1E20 atoms/$cm^3$.

Figure 2:
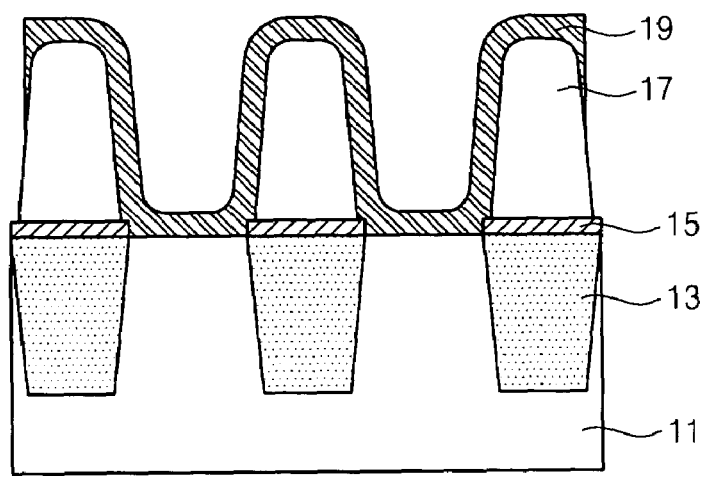
Figure 3:
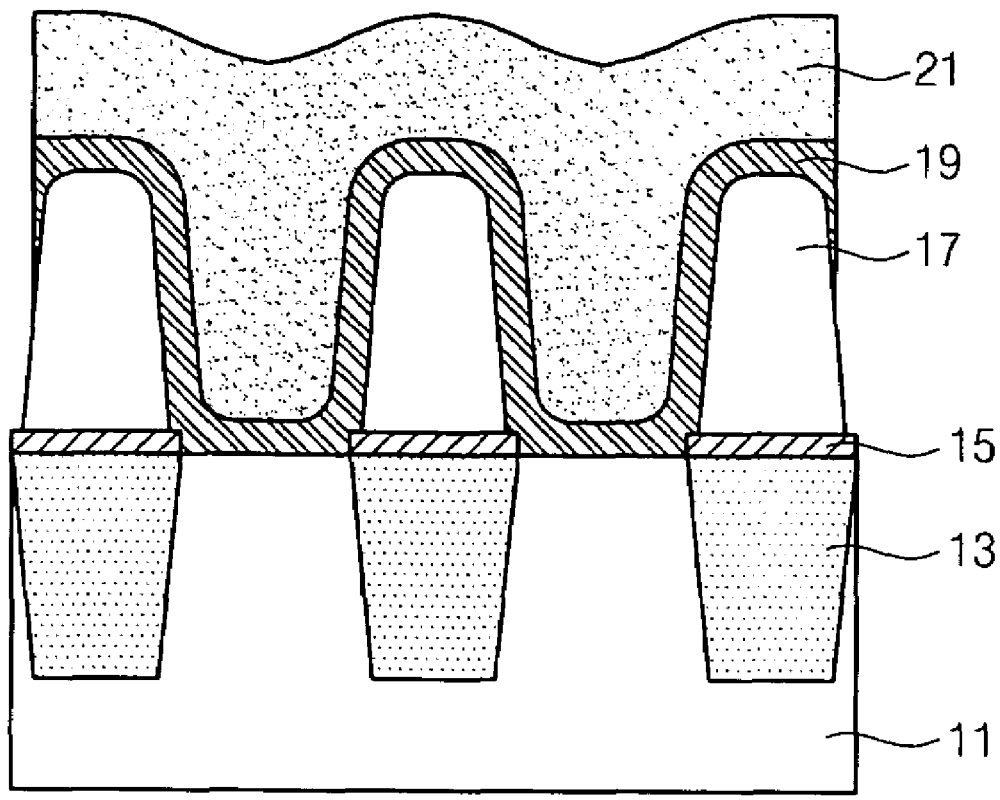

Then, as shown in FIGS. 2 and 3, a first contact plug layer 19 is deposited on the exposed surface of the silicon substrate 11 and the interlayer insulating film 17 to a thickness of 50–500 Å. On the first contact plug layer 19, a second contact plug layer 21 is deposited and then planarized. In this case, a portion of the first contact plug layer 19 at the interface with the exposed surface of the silicon substrate 11 is formed of monocrystalline silicon. The first and second contact plug layers 19 and 21 are formed by atmospheric chemical vapor deposition or low-pressure chemical vapor deposition, using one selected from $DCS/H_2/PH_3$, $MS/H_2/PH_3$ and $MS/PH_3$ as reaction gas.

In depositing the first contact plug layer 19, the MS (monosilane) gas is used at a flow rate of 100–500 sccm, the DCS (dichlorosilane) gas is used at the flow rate of 100–500 sccm, and the $H_2$ gas is used at a flow rate of 500–20,000 sccm. Also, the first contact plug layer is deposited under a pressure of 1–200 torr at a temperature of 500–700° C. Moreover, in this deposition step, 1% $PH_3$ is used at the flow rate of 100–1,000 sccm, and P impurity is used at the concentration of 1E20 to 5E20 atoms/$cm^3$.

In depositing the second contact plug layer 21, the MS gas is used at a flow rate of 100–500 sccm, the DCS gas is used at the flow rate of 100–500 sccm, and the $H_2$ gas is used at a flow rate of 500–20,000 sccm. Also, the second contact plug layer is deposited under a pressure of 1–200 torr at a temperature of 500–700° C. Moreover, 1% $PH_3$ is used at the flow rate of 100–1,000 sccm, and P impurity is used at the concentration of 1E19 to 2E20 atoms/$cm^3$. And the second contact layer is deposited to a thickness of 500–5,000 Å.

Another essential subject matter of the fabricating method according to the present invention is the step of treating the exposed surface of the silicon substrate 11 after forming and patterning the interlayer insulating film 17. In other words, the resistance between the silicon substrate having the junction regions therein and the silicon contact plug is determined by the step of treating the exposed surface of the silicon substrate 11.

In the present invention, the above-mentioned processes of treating the exposed surface of the silicon substrate 11 is used alone or in combination.

Hereinafter, the respective processes of treating the exposed surface of the silicon substrate 11 will be described in detail.

In the dry cleaning process, $NF_3$, $O_2$, He and $N_2$ gases are mixed at a suitable mixing ratio, and then applied to the substrate under a weak plasma power lower than 5 kW.

In the wet cleaning process, a diluted solution of $H_2O_2$, $H_2SO_4$, $NF_4OH$, HF, BOE or a combination thereof is used.

Furthermore, in the process of removing native oxides, $NF_3$ and $N_2$ gases is mixed at a suitable ratio to form plasma.

The plasma is then supplied to the substrate, which is then thermally treated for a period shorter than 10 minutes at a temperature of 100–500° C.

Moreover, in the process of thermally treating the substrate surface with hydrogen gas, the substrate surface is thermally treated with hydrogen gas by the in situ process in the same equipment as the deposition process, or by the ex situ process in the different equipment from the deposition process. In this case, the hydrogen gas is used at a flow rate of 1–10 SLM, and this thermal treatment is conducted at a temperature of 700–1,000° C. under a pressure of 1 mtorr-100 torr for a period shorter than 30 minutes.

After the surface treatment process as described above, the silicon contact plug is formed according to the present invention.

FIGS. 1 to 3 schematically show a cross-sectional shape of the silicon contact plug, which can be formed according to the present invention. As shown in FIGS. 1 to 3, on the exposed surface of the silicon substrate, which was treated as described above, monocrystalline silicon is grown, and on both sides of the exposed surface, i.e., on the surface of the patterned interlayer insulating film, polycrystalline silicon is grown.

At this time, in order to reduce the resistance between the silicon substrate and the silicon contact plug, the silicon contact plug is grown in the form of a two-layered contact plug. At this time, the two-layered contact plug consists of the first silicon contact plug layer 19 having high impurity concentration and the second silicon contact plug layer 21 having low impurity concentration.

If the two-layered silicon contact plug is formed in such a manner that the initial contact interface between the silicon substrate and the silicon contact plug has relatively high impurity concentration as described above, the resistance between the silicon substrate and the silicon contact plug can be further reduced. Furthermore, on the first silicon contact plug layer, the second silicon contact plug layer having low impurity concentration is formed so that the diffusion of impurity caused by the subsequent thermal treatment process can be prevented.

As described above, according to the fabricating method of the semiconductor device, a low-temperature process can be applied to form the silicon contact plug, and at the same time, the resistance between the silicon substrate and the silicon contact plug can be reduced.

Moreover, according to the present invention, the impurity doping concentration in the silicon contact plug can be reduced such that the diffusion of impurity from the polycrystalline silicon contact plug to the silicon substrate can be reduced. Thus, the present invention is greatly advantageous in that it can improve refresh characteristics critical to DRAM semiconductor devices. On the other words, in fabricating the DRAM semiconductor devices according to the prior art, a polycrystalline silicon contact plug is formed, which has high impurity concentration to reduce the resistance between the substrate and the contact plug. For this reason, the DRAM semiconductor devices fabricated according to the prior art have a problem in that junctions in the substrates become abrupt to increase electric field, thereby deteriorating the refresh characteristics.

By this reduction in resistance between the silicon substrate and the contact plug according to the present invention, cell current can be advantageously increased. Since a reduction in cell current results in a reduction in write/read capability between a bit line and a storage node and thus makes a device inferior, a reduction in contact resistance to the silicon substrate is a critical factor in view of the reliability of DRAM devices. Particularly, the method according to the present invention is advantageously a low temperature process, and thus, in highly integrated semiconductor devices of more than 1 Giga-bit DRAM, there is expected a greater reduction in thermal budget if the present invention is applied. Thus, the present invention will become a core technology in a process of forming a contact plug.

As a result, the present invention can be applied in forming a contact plug in highly integrated memory devices and system IC devices.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a contact plug in a semiconductor device having a silicon substrate for minimal resistance between the contact plug and the silicon substrate, which comprises the steps of:

forming a device isolation film defining a device region in a silicon substrate;

depositing a gate electrode material film on the silicon substrate and pattering the deposited gate electrode material film so as to form a gate electrode on the silicon substrate;

implanting impurity ions into the silicon substrate so as to form junction regions in the silicon substrate;

forming an interlayer insulating film on the silicon substrate and selectively patterning the interlayer insulating film so as to partially expose the surface of the silicon substrate; and forming a two-layered contact plug consisting of a first contact layer of monocrystalline silicon grown on the interlayer insulating film including the exposed surface of the silicon substrate at a temperature less than 700 degrees Celsius and a second contact layer of polycrystalline silicon on the first contact layer.

2. The method of claim 1, further comprising the step of treating the exposed surface of the silicon substrate by a process selected from the group consisting of a dry cleaning process, a wet cleaning process, a native oxide removal process, a thermal treatment process using hydrogen gas, and a surface treatment process using a laser.

3. The method of claim 2, wherein the dry cleaning process is carried out by treating the silicon substrate surface with a plasma mixture of $NF_3$, $Q_2$, He and $N_2$ of a suitable mixing ratio at a plasma power of less than 2 kW for a period shorter than 5 minutes, the wet cleaning process is carried out by treating the silicon substrate surface with a diluted solution of $H_2O_2$, $H_2SO_4$, $NF_4OH$, HF, BOE or a combination thereof, the native oxide removal process is carried out by thermally treating the silicon substrate surface with a plasma mixture of $NF_3$ and $N_2$ gases of a suitable mixing ratio at a temperature of 100–500° C. for a period shorter than 10 minutes, and the process of thermally treating the silicon substrate surface with hydrogen gas is carried out by an in situ process or an ex situ process using 1–10 slm hydrogen at a thermal treatment temperature of 700–1,000° C. under a pressure of 1 mtorr-100 torr for a period shorter than 30 minutes.

4. The method of claim 2, wherein the dry cleaning process, the wet cleaning process, the native oxide removal process, the thermal treatment process using hydrogen gas, and the surface treatment process using a laser are used independently or in combination.

5. The method of claim 2, further comprising the step of implanting an impurity into the exposed surface of the silicon substrate, after the step of treating the exposed surface of the silicon substrate.

6. The method of claim 5, wherein the impurity is P or As, which is implanted at an implantation energy of 10–100 KeV and a dose of 1E10–1E20 atoms/cm$^3$.

7. The method of claim 1, wherein the first or second contact plug layer is deposited by atmospheric pressure chemical vapor deposition or low-pressure chemical vapor deposition using DCS/H$_2$/PH$_3$, MS/H$_2$/PH$_3$ or MS/PH$_3$ gas.

8. The method of claim 7, wherein the MS gas is used at a flow rate of 100–500 sccm, the DCS gas is used at the flow rate of 100–500 sccm, and the H$_2$ gas is used at a flow rate of 500–20,000 sccm.

9. The method of claim 7, wherein the deposition of the first or second contact plug layer is carried out under a pressure of 1–200 torr at a temperature of 500–700° C.

10. The method of claim 1, wherein the first contact plug layer is formed to a thickness of 50–500 Å while using 1% PH$_3$ at a flow rate of 100–1,000 sccm, and P impurities at a concentration of 1E20 to 5E20 atoms/cm$^3$.

11. The method of claim 1, wherein the second contact plug layer is formed to a thickness of 500–5,000 Å while using 1% PH$_3$ at a flow rate of 100–1,000 sccm, and P impurities at the concentration of 1E19 to 2E20 atoms/cm$^3$.

12. A method for fabricating a contact plug in a semiconductor device having a silicon substrate for minimal resistance between the contact plug and the silicon substrate, which comprises the steps of:
    forming a device isolation film defining a device region in a silicon substrate;
    depositing a conductive layer on the silicon substrate and patterning the deposited conductive layer so as to form a gate electrode on the silicon substrate;
    implanting impurity ions into the silicon substrate so as to form junction regions in the silicon substrate;
    forming an interlayer insulating film on the silicon substrate and selectively patterning the interlayer insulating film so as to partially expose the surface of the silicon substrate;
    treating the exposed surface of the silicon substrate; and
    forming a two-layered contact plug consisting of a first contact plug layer of monocrystalline silicon grown on the interlayer insulating film including the exposed surface of the silicon substrate at a temperature less than 700 degrees Celsius and a second contact plug layer of polycrystalline silicon on the first contact layer.

13. The method of claim 12, wherein the step of treating the exposed surface of the silicon substrate by a process selected from the group consisting of a dry cleaning process, a wet cleaning process, a native oxide removal process, a thermal treatment process using hydrogen gas, and a surface treatment process using a laser.

14. The method of claim 13, wherein the dry cleaning process is carried out by treating the silicon substrate surface with a plasma mixture of NF$_3$, O$_2$, He and N$_2$ of a suitable mixing ratio at a plasma power of less than 2 kW for a period shorter than 5 minutes, the wet cleaning process is carried out by treating the silicon substrate surface with a diluted solution of H$_2$O$_2$, H$_2$SO$_4$, NF$_4$OH, HF, BOE or a combination thereof, the native oxide removal process is carried out by thermally treating the silicon substrate surface with a plasma mixture of NF$_3$ and N$_2$ gases of a suitable mixing ratio at a temperature of 100–500° C. for a period shorter than 10 minutes, and the process of thermally treating the silicon substrate surface with hydrogen gas is carried out by an in situ process or an ex situ process using 1–10 slm hydrogen at a thermal treatment temperature of 700–1,000° C. under a pressure of 1 mtorr-100 torr for a period shorter than 30 minutes.

15. The method of claim 12, further comprising the step of implanting an impurity into the exposed surface of the silicon substrate, after the step of treating the exposed surface of the silicon substrate, in which the impurity is P or As, which is implanted at an implantation energy of 10–100 KeV and a dose of 1E10–1E20 atoms/cm$^3$.

16. The method of claim 12, wherein the first or second contact plug layer is deposited by atmospheric pressure chemical vapor deposition or low-pressure chemical vapor deposition using DCS/H$_2$/PH$_3$, MS/H$_2$/PH$_3$ or MS/PH$_3$ gas.

17. The method of claim 16, wherein the MS gas is used at a flow rate of 100–500 sccm, the DCS gas is used at the flow rate of 100–500 sccm, and the H$_2$ gas is used at a flow rate of 500–20,000 sccm.

18. The method of claim 12 wherein the first contact plug layer is formed to a thickness of 50–500 Å while using 1% PH$_3$ at a flow rate of 100–1,000 sccm, and P impurities at a concentration of 1E20 to 5E20 atoms/cm$^3$, and the second contact plug layer is formed to a thickness of 500–5,000 Å while using 1% PH$_3$ at a flow rate of 100–1,000 sccm, and P impurities at the concentration of 1E19 to 2E20 atoms/cm$^3$.

* * * * *